(12) United States Patent
Kikuchi

(10) Patent No.: US 8,704,156 B2
(45) Date of Patent: Apr. 22, 2014

(54) SOLID-STATE IMAGE PICKUP APPARATUS, ELECTRONIC APPARATUS, AND METHOD OF MANUFACTURING A SOLID-STATE IMAGE PICKUP APPARATUS

(71) Applicant: Sony Corporation, Tokyo (JP)

(72) Inventor: Koji Kikuchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/948,540

(22) Filed: Jul. 23, 2013

(65) Prior Publication Data

US 2013/0302936 A1 Nov. 14, 2013

Related U.S. Application Data

(62) Division of application No. 12/657,815, filed on Jan. 28, 2010, now Pat. No. 8,530,812.

(30) Foreign Application Priority Data

Jan. 29, 2009 (JP) ................................ P2009-017469

(51) Int. Cl.
| | |
|---|---|
| H01L 21/00 | (2006.01) |
| H01L 27/14 | (2006.01) |
| H01L 27/146 | (2006.01) |
| H01L 31/0232 | (2006.01) |
| H01L 31/18 | (2006.01) |

(52) U.S. Cl.
USPC ......... 250/227.2; 250/208.1; 348/69; 348/70; 348/73

(58) Field of Classification Search
USPC ........ 438/57, 60, 65, 66, 69, 70, 73; 257/432, 257/434, 436, E31.127; 250/216, 227.11, 250/227.2, 208.1
See application file for complete search history.

(56) References Cited

U.S. PATENT DOCUMENTS

| | | | |
|---|---|---|---|
| 6,166,369 A | 12/2000 | Assadi et al. | |
| 6,861,686 B2* | 3/2005 | Lee et al. | 257/291 |
| 7,125,738 B2* | 10/2006 | Huang et al. | 438/48 |
| 7,135,666 B2 | 11/2006 | Dobashi | |
| 7,196,365 B2 | 3/2007 | Yamamura | |
| 7,326,588 B2* | 2/2008 | Yaung et al. | 438/57 |
| 7,522,801 B2* | 4/2009 | Makita | 385/129 |
| 7,655,495 B2* | 2/2010 | Adkisson et al. | 438/60 |
| 7,666,704 B2 | 2/2010 | Suzuki et al. | |
| 7,745,268 B2 | 6/2010 | Miyairi | |
| 7,968,888 B2 | 6/2011 | Yamaguchi et al. | |
| 7,973,271 B2* | 7/2011 | Toumiya et al. | 250/208.1 |
| 8,003,929 B2 | 8/2011 | Toumiya et al. | |
| 8,013,409 B2* | 9/2011 | Itahashi | 257/432 |
| 8,053,333 B2 | 11/2011 | Miyairi | |
| 8,187,905 B2 | 5/2012 | Yin et al. | |
| 8,237,237 B2 | 8/2012 | Wano et al. | |
| 8,384,817 B2* | 2/2013 | Abe | 348/335 |

(Continued)

FOREIGN PATENT DOCUMENTS

JP 2008-109153 A 5/2008

*Primary Examiner* — John Lee
(74) *Attorney, Agent, or Firm* — Lerner, David, Littenberg, Krumholz & Mentlik, LLP

(57) ABSTRACT

Disclosed is a solid-state image pickup apparatus including a photoelectric converter formed on a substrate, a wiring portion formed above the photoelectric converter and constituted of multilayer wirings, and an insulating portion in which the multilayer wirings of the wiring portion are embedded, the insulating portion having a refractive index larger than a silicon oxide.

3 Claims, 7 Drawing Sheets

(56) References Cited

U.S. PATENT DOCUMENTS

| | | |
|---|---|---|
| 2004/0140564 A1 | 7/2004 | Lee et al. |
| 2004/0251477 A1* | 12/2004 | Pourquier et al. ............ 257/225 |
| 2006/0076636 A1 | 4/2006 | Fukunaga |
| 2006/0115230 A1* | 6/2006 | Komoguchi et al. ......... 385/146 |
| 2006/0278948 A1 | 12/2006 | Yamaguchi et al. |
| 2007/0177044 A1 | 8/2007 | Maruyama et al. |
| 2007/0205439 A1 | 9/2007 | Okita et al. |
| 2007/0212804 A1 | 9/2007 | Sasaki et al. |
| 2007/0262366 A1 | 11/2007 | Baek et al. |
| 2007/0275496 A1* | 11/2007 | Yamashita et al. .............. 438/57 |
| 2008/0029793 A1 | 2/2008 | Watanabe et al. |
| 2008/0135732 A1 | 6/2008 | Toumiya et al. |
| 2008/0173903 A1 | 7/2008 | Imai et al. |
| 2008/0299743 A1 | 12/2008 | Miyairi |
| 2009/0035887 A1 | 2/2009 | Suzuki et al. |
| 2009/0136174 A1* | 5/2009 | Itahashi ......................... 385/14 |
| 2010/0025571 A1 | 2/2010 | Toumiya et al. |
| 2010/0053390 A1 | 3/2010 | Takubo et al. |
| 2010/0078744 A1 | 4/2010 | Wano et al. |
| 2010/0078745 A1 | 4/2010 | Wano et al. |
| 2010/0187403 A1 | 7/2010 | Kikuchi |
| 2010/0221858 A1 | 9/2010 | Miyairi |
| 2010/0230578 A1 | 9/2010 | Horikoshi et al. |
| 2011/0233703 A1 | 9/2011 | Nakamura |
| 2011/0281391 A1 | 11/2011 | Itahashi |

* cited by examiner

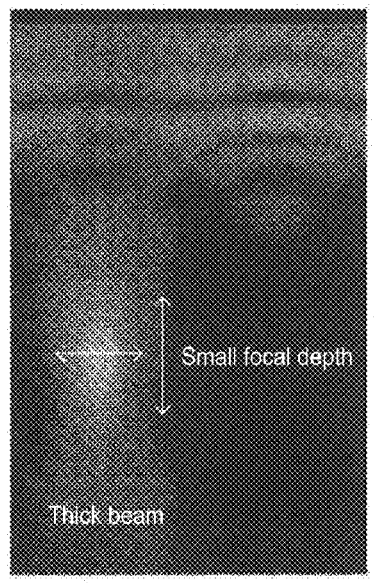 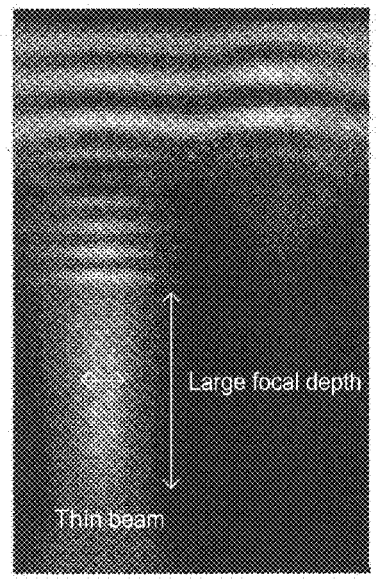
FIG. 2A  FIG. 2B
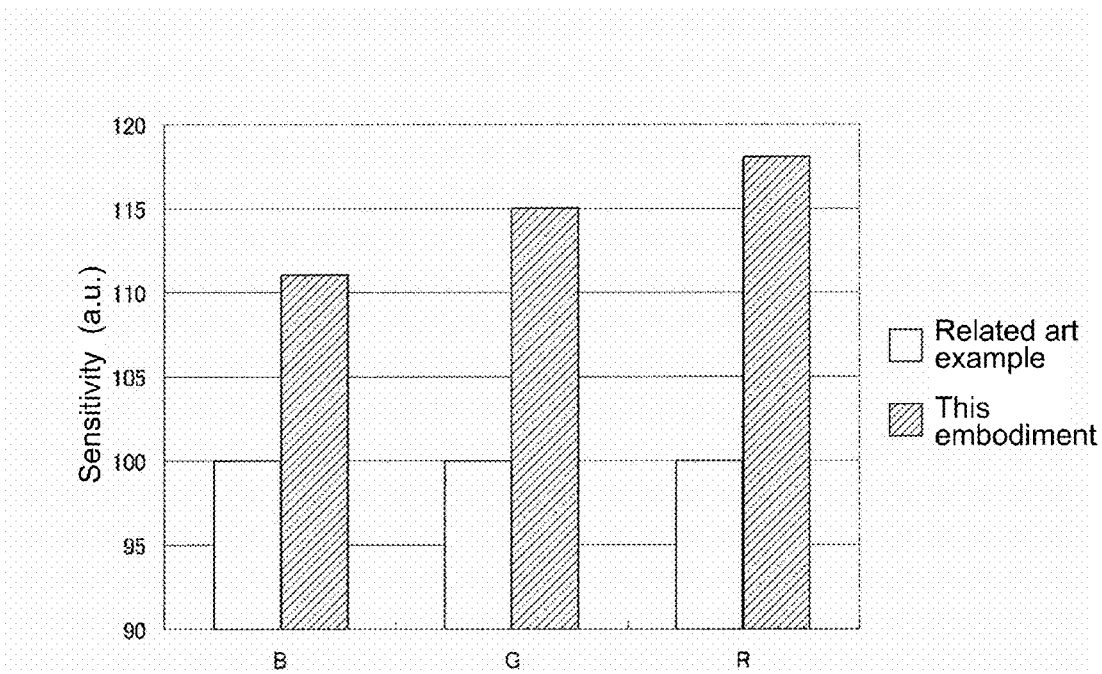
FIG.3

SOLID-STATE IMAGE PICKUP APPARATUS, ELECTRONIC APPARATUS, AND METHOD OF MANUFACTURING A SOLID-STATE IMAGE PICKUP APPARATUS

CROSS-REFERENCE TO RELATED APPLICATION

The present application is a divisional of U.S. patent application Ser. No. 12/657,815, filed on Jan. 28, 2010, which claims priority from Japanese Patent Application No. JP 2009-017469 filed in the Japanese Patent Office on Jan. 29, 2009, all of which are incorporated herein by reference.

BACKGROUND OF THE INVENTION

1. Field of the Invention

The present invention relates to a solid-state image pickup apparatus, an electronic apparatus, and a method of manufacturing a solid-state image pickup apparatus. In particular, the present invention relates to a solid-state image pickup apparatus, an electronic apparatus, and a method of manufacturing a solid-state image pickup apparatus for causing light to enter a photoelectric converter through a wiring layer.

2. Description of the Related Art

A semiconductor image sensor typified by a CMOS (complementary metal oxide semiconductor) image sensor is demanded to reduce a pixel size and increase the number of pixels in the same image area. For example, Japanese Patent Application Laid-open No. 2008-109153 discloses a solid-state image sensor in which an optical waveguide is provided above a photoelectric converter formed on a semiconductor substrate.

SUMMARY OF THE INVENTION

However, in related art, for forming an optical waveguide, a thin film made of a material having a refractive index larger than a material therearound is deposited on an inner wall of a concave portion in which the optical waveguide is to be formed, and then the concave portion is filled with a material having a high filling performance. In this way, for forming the optical waveguide formed above the photoelectric converter, there is a problem in that two materials have to be used for forming the optical waveguide in terms of the filling performance of the material into the concave portion.

In view of the above-mentioned circumstances, it is desirable to provide a technique of efficiently transmitting an optical signal to a photoelectric converter through a wiring layer, making it possible to obtain a sufficient amount of signals.

According to an embodiment of the present invention, there is provided a solid-state image pickup apparatus including a photoelectric converter formed on a substrate, a wiring portion formed above the photoelectric converter and constituted of multilayer wirings, and an insulating portion in which the multilayer wirings of the wiring portion are embedded. The insulating portion has a refractive index larger than a silicon oxide. Further, there is provided an electronic apparatus that uses the solid-state image pickup apparatus.

In the embodiment, because the insulating portion in which the wirings of the wiring portion formed above the photoelectric converter is made of the material whose refractive index is larger than the silicon oxide, a process of forming an optical waveguide obtained by embedding a material in the concave portion is not necessary. In addition, as compared to a case where the insulating portion is made of the silicon oxide, a beam waist diameter of transmitted light can be reduced, and therefore a light energy can be locally collected, which can transmit the light to the photoelectric converter.

Further, according to another embodiment of the present invention, there is provided a solid-state image pickup apparatus including a photoelectric converter formed on a substrate, a wiring portion formed above the photoelectric converter and constituted of multilayer wirings, a silicon oxide in which the multilayer wirings of the wiring portion are embedded, and an insulating portion embedded in the silicon oxide from a position above the wiring portion up to a position of a lowermost wiring above the photoelectric converter. The insulating portion has a refractive index larger than the silicon oxide. In addition, there is provided an electronic apparatus that uses the solid-state image pickup apparatus.

In the embodiment, the insulating portion embedded from the position above the wiring portion up to the position of the lowermost wiring above the photoelectric converter functions as the optical waveguide. Because the optical waveguide is made of one material whose refractive index is larger than that of the silicon oxide, it is not necessary to form the optical waveguide by a plurality of materials.

Further, there is provided a method of manufacturing a solid-state image pickup apparatus. The method of manufacturing a solid-state image pickup apparatus includes forming a photoelectric converter on a substrate, forming a drive element on the substrate, forming an insulating film on the drive element, flattening a surface formed, forming a wiring layer with a waveguide portion by forming, on the insulating film, a wiring embedded in an interlayer insulating film, a concave portion provided in a part of the interlayer insulating film above the photoelectric converter, and the waveguide portion formed by embedding, in the concave portion, a material having a refractive index larger than the interlayer insulating film, and repeatedly performing the formation of the wiring layer with the waveguide portion, to form an optical waveguide through the formation of the multilayer wirings and connection of a plurality of waveguide portions.

In the above embodiment, the waveguide portion that is a part of the optical waveguide is formed each time the one wiring layer is formed. By repeatedly performing the formation of the wiring layer with the waveguide portion, the optical waveguide is formed. Thus, the optical waveguide can be made of one material.

Here, the insulating portion is made of a material selected from a group consisting of a silicon nitride, a silicon oxynitride, a hafnium oxide, and a tantalum oxide.

According to the present invention, the insulating portion having the light collecting performance that is more excellent than the silicon oxide can be formed of the one material above the photoelectric converter.

These and other objects, features and advantages of the present invention will become more apparent in light of the following detailed description of best mode embodiments thereof, as illustrated in the accompanying drawings.

BRIEF DESCRIPTION OF DRAWINGS

FIGS. 2A and 2B are diagrams showing comparison examples of beam waists of light that passes through the solid-state image pickup apparatus;

FIG. 3 is a diagram showing a comparison example of sensitivities corresponding to colors of RGB of the solid-state image pickup apparatus in the first embodiment;

DESCRIPTION OF PREFERRED EMBODIMENTS

Hereinafter, embodiments of the present invention will be described with reference to the drawings. The embodiments will be described in an order of the following items.

1. First embodiment (structure, beam waist, sensitivity comparison)
2. Second embodiment (structure, sensitivity comparison)
3. Method of manufacturing solid-state image pickup apparatus (example of method of manufacturing solid-state image pickup apparatus according to second embodiment)
4. Electronic apparatus (example of image pickup apparatus)

1. First Embodiment

Structure

Figure 1:
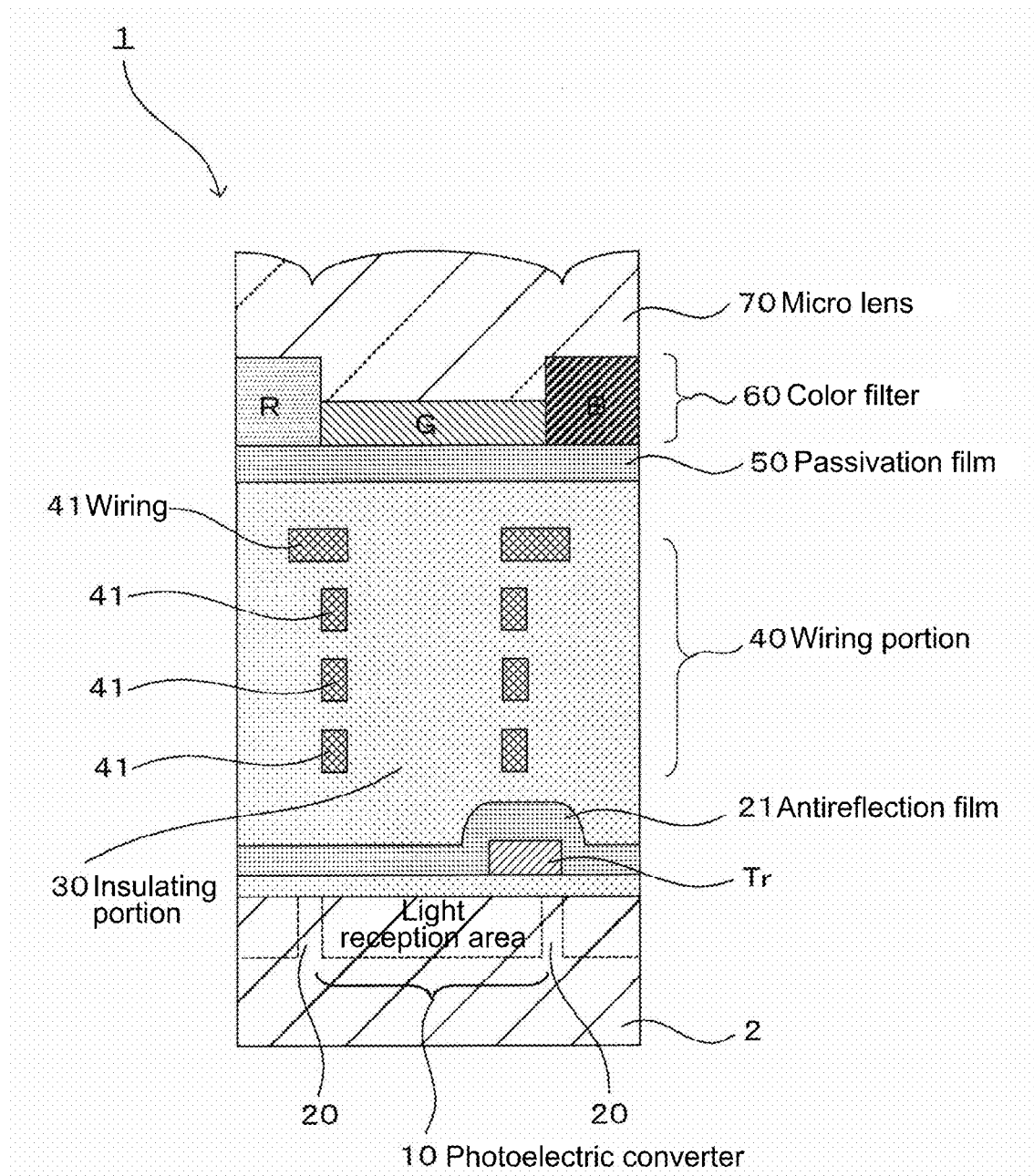
FIG. 1 is a schematic cross-sectional view showing a solid-state image pickup apparatus according to a first embodiment.

FIG. 1 is a schematic cross-sectional view showing a solid-state image pickup apparatus according to a first embodiment. A solid-state image pickup apparatus 1 includes a photoelectric converter 10 and a transistor Tr. The photoelectric converter 10 is formed in a substrate 2 formed of a semiconductor such as silicon. The transistor Tr is formed on the substrate 2. Further, the solid-state image pickup apparatus 1 includes a wiring portion 40, a passivation film 50, a color filter 60, and a micro lens 70. The wiring portion 40 is formed on the transistor Tr through an antireflection film 21. The passivation film 50 is formed on the wiring portion 40. The micro lens 70 is formed so as to correspond to each color of the color filter 60.

The photoelectric converter 10 formed in the substrate 2 is a light reception area that is formed so as to correspond to each pixel, and converts, into an electrical signal, incident light that travels through the micro lens 70 and the color filter 60. The transistor Tr on the substrate 2 may be various transistors such as a read transistor that reads a charge obtained in the photoelectric converter 10, an amplification transistor that amplifies an output of the photoelectric converter 10, a selection transistor that selects the photoelectric converter 10, and a reset transistor that discharges the charge.

The antireflection film 21 is formed on the transistor Tr, and the wiring portion 41 constituted of a plurality of wirings 41 in a multilayer structure is formed thereon through an insulating portion 30. The wirings 41 of the wiring portion are embedded in the insulating portion 30 and form the multilayer structure through the insulating portion 30 between the layers. Above the photoelectric converter 10 and the wiring potion 40, the wirings 41 are not provided, so the incident light that travels through the micro lens 70 and the color filter 60 passes through the insulating portion 30 and reaches the photoelectric converter 10.

Above the wiring potion 40, the color filters 60 of R (red), G (green), and B (blue) for each predetermined area are formed in a predetermined arrangement order. In addition, the micro lens 70 is formed so as to correspond to each of the color filters. In this embodiment, an opening of one light reception area is set to 1.4 μm□.

In the solid-state image pickup apparatus 1 of this embodiment, as the insulating portion 30 in which the wirings 41 of the wiring portion 40 are embedded, a material having a refractive index larger than a silicon oxide is used.

Here, the insulating portion 30 in which the wirings 41 are embedded includes a part corresponding to interlayers between the wirings 41 in addition to a part corresponding to the layers in which the wirings portions 41 are provided. That is, in this embodiment, the whole of the plurality of wirings 41 that constitutes the wiring portion 40 is embedded in the wiring portion 30.

Examples of the material having the refractive index larger than the silicon oxide and being used as the insulating portion 30 include a silicon nitride, a silicon oxynitride, a hafnium oxide, and a tantalum oxide.

Here, the silicon nitride has a refractive index of about 2.0 to 2.2 in a visual light range and can be easily formed in a general semiconductor manufacturing apparatus. Further, the silicon oxynitride has the refractive index of about 1.7 to 1.8 in the visual light range and can be easily formed in the general semiconductor manufacturing apparatus. In addition, the hafnium oxide has the refractive index of about 2.0 and has a characteristic of having a smaller light absorption than the silicon nitride. In addition, the tantalum oxide has the refractive index of about 2.0 in the visual light range and has a characteristic of having a smaller light absorption than the silicon nitride.

Beam Waist

FIGS. 2A and 2B are diagrams showing comparison examples of beam waists of light that passes through the solid-state image pickup apparatus. FIG. 2A shows a case where the silicon oxide is used as the insulating portion in which the wirings are embedded (example in related art). FIG. 2B shows a case where the silicon nitride is used as the insulating portion in which the wirings are embedded (this embodiment). In FIGS. 2A and 2B, a vertical direction of the figures corresponds to a depth direction of the insulating portion, and a lateral direction of the figures corresponds to a width direction of the insulating portion.

As shown in the figures, a beam waist diameter of the traveling light in the case where the silicon nitride is used as the insulating portion (FIG. 2B) is smaller than that in the case where the silicon oxide is used as the insulating portion (FIG. 2A). Therefore, in the case where the silicon nitride is used as the insulating portion (FIG. 2B) in this embodiment, collected light can be efficiently transmitted to the photoelectric converter disposed below the insulating portion. In addition, a focal depth in the case of this embodiment in which the silicon nitride is used is larger than the case in related art in which the silicon oxide is used.

Sensitivity Comparison

FIG. 3 is a diagram showing a comparison example of sensitivities corresponding to the colors of RGB of the solid-state image pickup apparatus in the first embodiment. FIG. 3 shows the sensitivities of the colors of RGB in the case where the silicon nitride is used as the insulating portion (this embodiment) as relative values with respect to sensitivities of the colors of RGB in the case where the silicon oxide is used as the insulating portion (example in related art) with the sensitivities in related art being set as 100.

In this embodiment in which the silicon nitride is used as the insulating portion, the sensitivities of a B (blue) pixel, a G (green) pixel, and an R (red) pixel are increased by about 12%, 15%, and 18%, respectively, as compared to the example in related art in which the silicon oxide is used as the insulating portion. This is because, as shown in FIGS. 2A and 2B, the beam waist becomes thinner and the focal depth becomes larger in the case where the silicon nitride is used as the insulating portion as compared to the case where the silicon oxide is used as the insulating portion, and the efficiency of light transmission in the insulating portion is increased for each of the colors (wavelengths) of RGB, which contributes to the improvement of the sensitivities.

2. Second Embodiment

Structure

Figure 4:
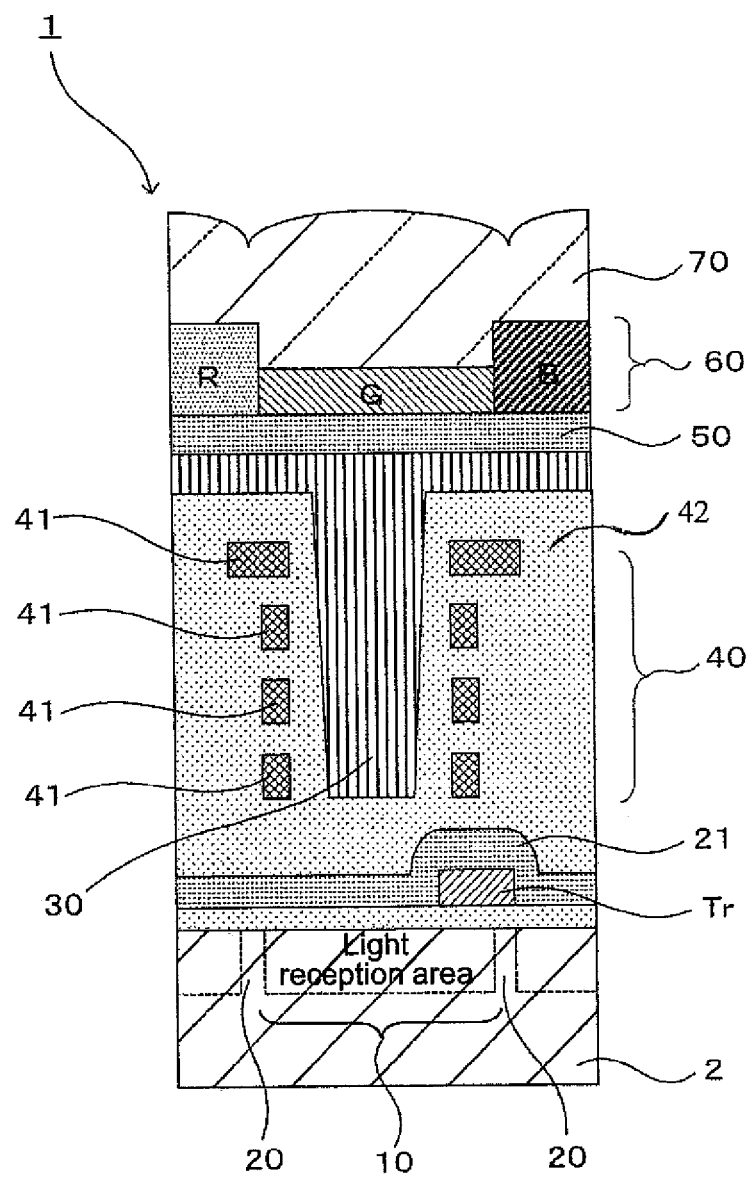
FIG. 4 is a schematic cross-sectional view showing a solid-state image pickup apparatus according to a second embodiment.

FIG. 4 is a schematic cross-sectional view showing a solid-state image pickup apparatus according to a second embodiment. The solid-state image pickup apparatus 1 includes the photoelectric converter 10 and the transistor Tr. The photoelectric converter 10 is formed in the substrate 2 formed of the semiconductor such as silicon. The transistor Tr is formed on the substrate 2. Further, the solid-state image pickup apparatus 1 includes the wiring portion 40, the passivation film 50, the color filter 60, and the micro lens 70. The wiring portion 40 is formed on the transistor Tr through the antireflection film 21. The passivation film 50 is formed on the wiring portion 40. The micro lens 70 is formed so as to correspond to each color of the color filter 60.

The photoelectric converter 10 formed in the substrate 2 is the light reception area that is formed so as to correspond to each pixel, and converts, into an electrical signal, incident light that travels through the micro lens 70 and the color filter 60. The transistor Tr formed on the substrate 2 may be various transistors such as the read transistor that reads a charge obtained in the photoelectric converter 10, the amplification transistor that amplifies an output of the photoelectric converter 10, the selection transistor that selects the photoelectric converter 10, and the reset transistor that discharges the charge.

The antireflection film 21 is formed on the transistor Tr, and the wiring portion 41 constituted of the plurality of wirings 41 in the multilayer structure is formed thereon. The wirings 41 of the wiring portion 40 are embedded in a wiring insulating portion 42 formed of the silicon oxide and form the multilayer structure through the wiring insulating portion 42 between the layers. In a part of an area in the wiring insulating portion 42 above the photoelectric converter 10, the insulating portion 30 having the refractive index larger than the silicon oxide is provided.

The insulating portion 30 is embedded in the wiring insulating portion 42 from a position of an upper area of the wiring portion 40 up to a position of the wirings 41 in the lowermost layer. With this structure, the insulating portion 30 functions as the optical waveguide. That is, incident light that travels through the micro lens 70 and the color filter 60 is transmitted along the insulating portion 30 and reaches the photoelectric converter 10.

Here, examples of the material having the refractive index larger than the silicon oxide and being used as the insulating portion 30 include a silicon nitride, a silicon oxynitride, a hafnium oxide, and a tantalum oxide. The characteristics of those materials are the same as in the first embodiment.

As described above, by using the silicon oxide as the wiring insulating portion 42 provided between the wirings 41 and between the layers, a parasitic capacitance between the wirings 41 can be reduced as compared to the case where silicon nitride is used. In addition to this, the insulating portion 30 formed of the material whose refractive index is larger than the silicon oxide film is embedded in the light transmission path. Therefore, as in the comparison example shown in FIG. 2B, the beam waist diameter can be reduced as compared to the case where the silicon oxide is used, and the focal depth can be increased, with the result that the light collection efficiency to the photoelectric converter 10 can be improved.

Sensitivity Comparison

Figure 5:
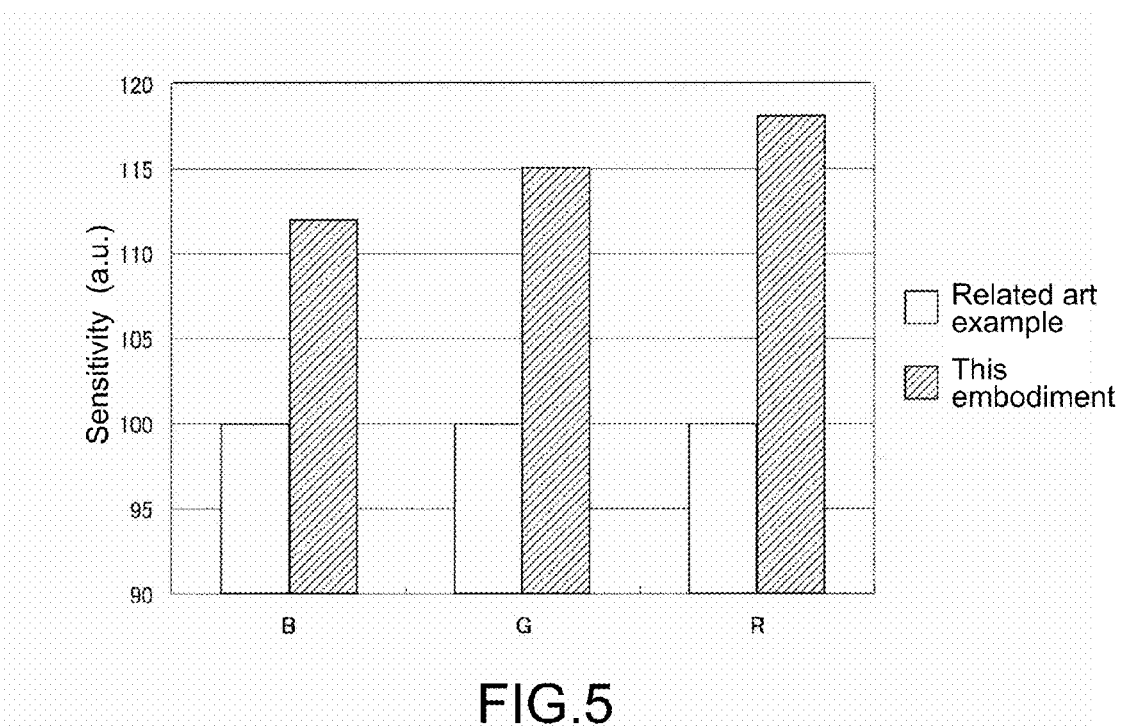
FIG. 5 is a diagram showing a comparison example of sensitivities of colors of RGB of the solid-state image pickup apparatus in the second embodiment.

FIG. 5 is a diagram showing a comparison example of sensitivities of the colors of RGB of the solid-state image pickup apparatus in the second embodiment. FIG. 5 shows the sensitivities of the colors of RGB in the case where the silicon nitride is used as the insulating portion (this embodiment) as relative values with respect to sensitivities of the colors of RGB in the case where the silicon oxide is used as the insulating portion (example in related art) with the sensitivities in related art being set as 100. Further, in this example, a silicon oxide of 200 nm×200 nm in a lateral direction and an upward direction of the wirings, respectively, is provided.

In this embodiment in which the silicon nitride is used as the insulating portion, the sensitivities of a B (blue) pixel, a G (green) pixel, and an R (red) pixel are increased by about 12%, 14%, and 18%, respectively, as compared to the example in related art in which the silicon oxide is used as the insulating portion. This result shows that the sensitivities similar to those of the solid-state image pickup apparatus in the first embodiment can be obtained.

3. Method of Manufacturing Solid-State Image Pickup Apparatus

FIGS. 6A to 6C and 7A to 7C are schematic cross-sectional views sequentially showing a method of manufacturing the solid-state image pickup apparatus according to the embodiments. In the method of manufacturing the solid-state image pickup apparatus shown in FIGS. 6A to 6C and 7A to 7C, the structure of the solid-state image pickup apparatus according to the second embodiment is used as an example.

Figure 6A:
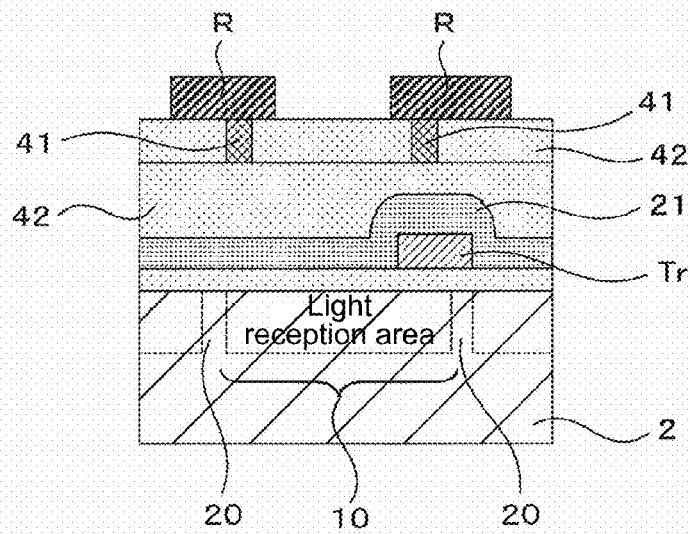
FIGS. 6A, 6B and 6C are schematic cross-sectional views (part 1) showing a method of manufacturing the solid-state image pickup apparatus according to the second embodiment.

First, as shown in FIG. 6A, on a surface of the substrate 2 made of silicon or the like, an element isolation portion 20 that isolates the photoelectric converter 10 corresponding to each color is formed by performing P-type ion implantation, and the photoelectric converter 10 corresponding to each color is formed between the element isolation portions 20 by performing the ion implantation of N-type and P-type impurities.

After the photoelectric converter 10 is formed, the transistor Tr for pixel drive or the like is formed on the substrate 2, and the antireflection film 21 is formed on the entire surface of the transistor Tr. Further, on the antireflection film 21, the wiring 41 embedded in the wiring insulating portion 42 is formed. In this case, the structure in which the wiring 41 is embedded in the wiring insulating portion 42 is referred to as the wiring layer. For forming the wiring layer, a method in which the silicon oxide film serving as the wiring insulating portion 42 is formed on the entire surface, a part corresponding to the wiring 41 is removed by photolithography, and the wiring material is embedded in the part removed may be used. Also, a method in which the wiring 41 is subjected to patterning in advance, and the wiring 41 is embedded with the silicon oxide serving as the wiring insulating portion 42, to make the surface flat may be used.

In both methods, after the wiring layer is formed, a photosensitive material (resist) R is applied on the wiring insulating portion 42, and the photolithography is performed, thereby opening a position corresponding to the photoelectric converter 10.

Figure 6B:
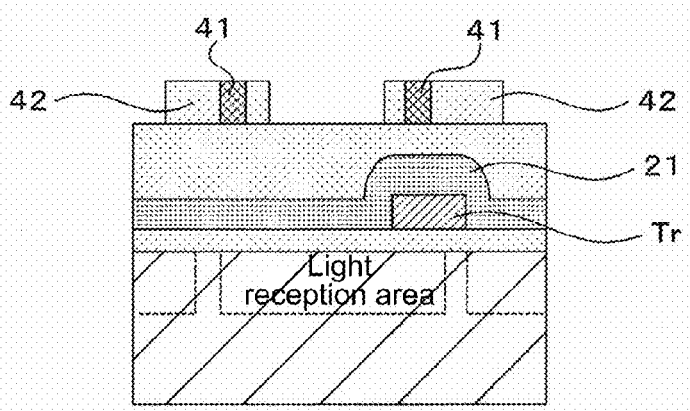

Next, as shown in FIG. 6B, the wiring insulating portion 42 is etched by using, as a mask, the photosensitive material R opened. As a result, the wiring insulating portion 42 corresponding to the opening portion of the photosensitive material R is etched. After that, the photosensitive material R is removed.

Figure 6C:
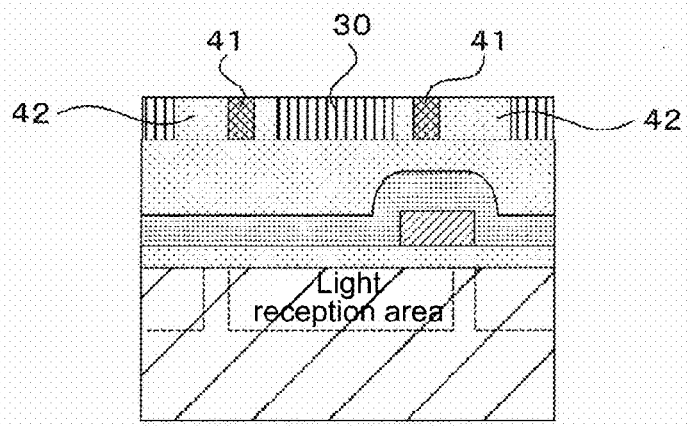

Next, as shown in FIG. 6C, the insulating portion 30 is embedded in the etching portion of the wiring insulating portion 42. As the insulating portion 30, the material whose refractive index is larger than the silicon oxide is used, that is, any one of the silicon nitride, the silicon oxynitride, the hafnium oxide, and the tantalum oxide is used.

The insulating portion 30 embedded in the wiring layer serves as a part of the optical waveguide thereafter. After the insulating portion 30 is embedded, the surface is flattened by CMP (chemical mechanical polishing), for example. As a result of the formation of the wirings 41 and the wiring insulating portions 42, the etching of the wiring insulating portion, the embedment of the insulating portion, and the flatting operation in the processes shown in FIGS. 6A to 6C, one wiring layer provided with a waveguide is formed.

Figure 7A:
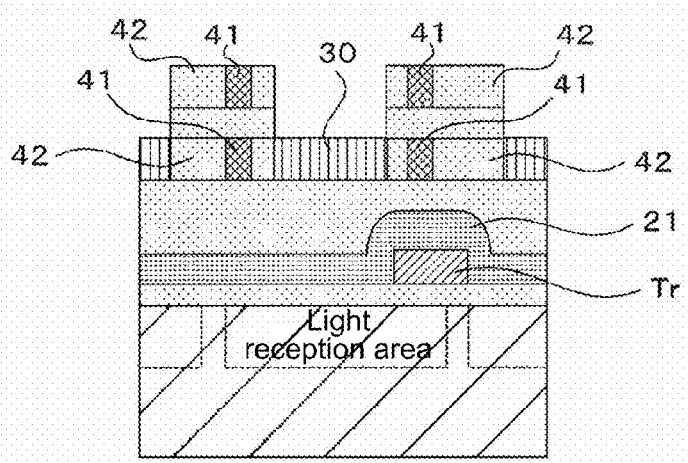
FIGS. 7A, 7B AND 7C are schematic cross-sectional views (part 2) showing a method of manufacturing the solid-state image pickup apparatus according to the second embodiment.
Figure 7B:
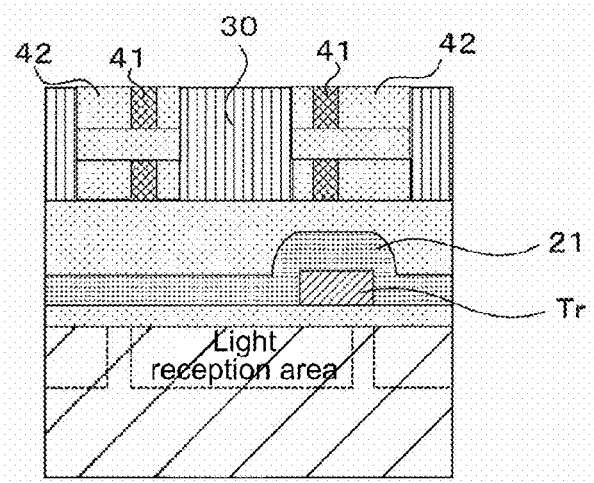

Subsequently, the formation of the one wiring layer provided with the waveguide is repeatedly performed multiple times. That is, as shown in FIG. 7A, the wiring insulating portion 42 is formed on the one wiring layer with the waveguide, and the wiring portion 41 and the concave portion are formed. The concave portion is formed by the etching. Then, as shown in FIG. 7B, the insulating portion 30 is embedded in the concave portion, to make the surface flat by the CMP or the like.

Figure 7C:
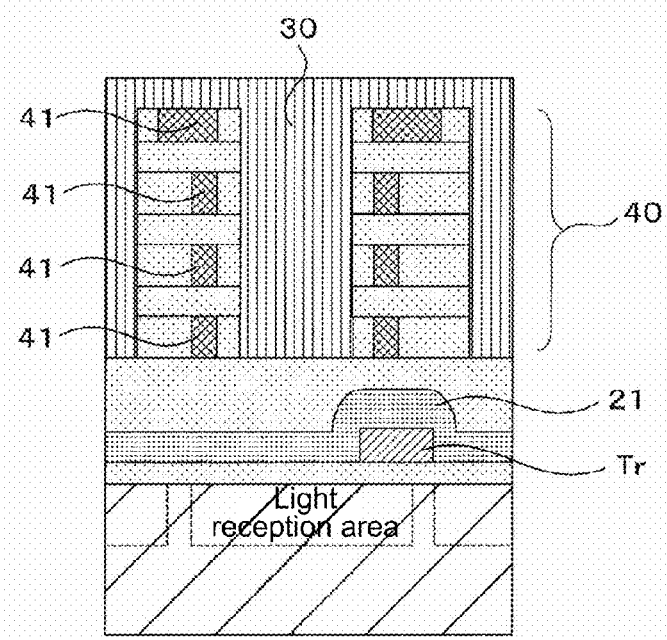

By repeatedly performing the formation of the wiring layer with the waveguide in a layered manner, the wiring portion 40 provided with the wirings 41 in the plurality of layers is formed as shown in FIG. 7C. On the wiring portion 40, the same material as the insulating portion 30 is formed. With this structure, from the position of the upper surface of the wiring portion 40 up to the position of the wirings 41 in the lowermost layer of the wiring portion 40, the insulating portion 30 is continuously formed in the wiring insulating portion 42 with the insulating portion 30 being embedded therein, and thus serves as the optical waveguide.

After that, the passivation film 50 (see, FIG. 4) is formed on the insulating portion 30, the color filter 60 (see, FIG. 4) is formed so as to correspond to each of the photoelectric converters 10, and the micro lens 70 (see, FIG. 4) is formed. As a result, the solid-state image pickup apparatus 1 according to the second embodiment as shown in FIG. 4 is completed.

According to the manufacturing method described above, the insulating portion 30 provided above the photoelectric converter 10 is formed as the optical waveguide. Even in a case where a large number of layers of the wirings 41 of the wiring portion 40 are to be provided, the optical waveguide structure in which the one material is used as the insulating portion 30 can be formed by layering the wiring layers with the waveguide.

It should be noted that in forming the wiring layer with the waveguide, if the insulating portion 30 serving as the part of the optical waveguide is formed so as to have a trapezoidal cross section in which the lower base is shorter than the upper base, and the length of the insulating portion 30 is fitted to the upper and lower layers, an optical waveguide formed of the insulating portion 30 can be formed into a downwardly tapered shape.

4. Electronic Apparatus

Figure 8:
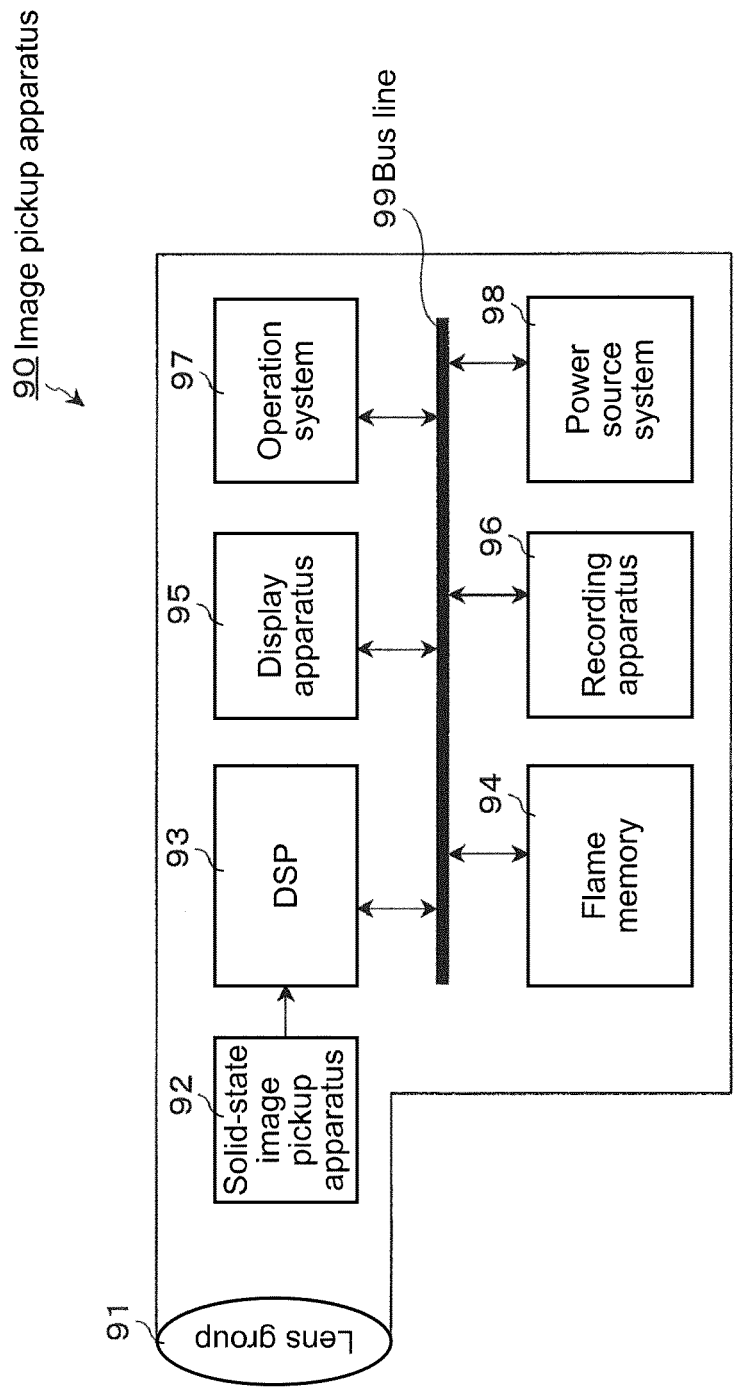
FIG. 8 is a block diagram showing a structural example of an image pickup apparatus as an example of an electronic apparatus according to the embodiments.

FIG. 8 is a block diagram showing a structural example of an image pickup apparatus as an example of an electronic apparatus according to the above embodiments. As shown in FIG. 8, an image pickup apparatus 90 includes an optical system having a lens group 91, a solid-state image pickup apparatus 92, a DSP circuit 93 that is a camera signal processing circuit, a frame memory 94, a display apparatus 95, a recording apparatus 96, an operation system 97, and a power source system 98. Among those components, the DSP circuit 93, the frame memory 94, the display apparatus 95, the recording apparatus 96, the operation system 97, and the power source system 98 are mutually connected through a bus line 99.

The lens group 91 collects incident light (image light) from a subject and forms an image on an imaging surface of the solid-state image pickup apparatus 92. The solid-state image pickup apparatus 92 converts a light amount of the incident light that is imaged on the imaging surface by the lens group 91 into an electrical signal for each pixel, and outputs it as a pixel signal. As the solid-state image pickup apparatus 92, the structure of the solid-state image pickup apparatus according to the above embodiments is used.

The display apparatus 95 is formed of a panel-type display apparatus such as a liquid crystal display apparatus and an organic EL (electro-luminescence) display apparatus, and displays a moving image or a still image taken by the solid-state image pickup apparatus 92. The recording apparatus 96 records the moving image or the still image taken by the solid-state image pickup apparatus 92 on a recording medium such as a non-volatile memory, a videotape, and a DVD (digital versatile disk).

The operation system 97 gives operation commands for various functions of the image pickup apparatus under the control of a user. The power source system 98 appropriately supplies various power sources as operation sources to the DSP circuit 93, the frame memory 94, the display apparatus 95, the recording apparatus 96, and the operation system 97.

The image pickup apparatus 90 as described above is applied to a camera module for a mobile apparatus, such as a video camera, a digital still camera, and a camera cellular phone. By using the solid-state image pickup apparatus according to the above embodiments as the solid-state image pickup apparatus 92, the image pickup apparatus excellent in the sensitivity can be provided.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state image pickup apparatus, comprising:
    forming a photoelectric converter on a substrate;
    forming a drive element on the substrate, forming an insulating film on the drive element, and flattening a surface formed;

forming a wiring layer with a waveguide portion by forming, on the insulating film, a wiring embedded in an interlayer insulating film, a concave portion provided in a part of the interlayer insulating film above the photoelectric converter, and the waveguide portion formed by embedding, in the concave portion, a material having a refractive index larger than the interlayer insulating film; and performing at least one additional forming of an additional wiring layer with an additional waveguide portion, wherein the at least one additional forming is by forming, over the interlayer insulating film, an additional wiring embedded in an additional interlayer insulating film, an additional concave portion provided in a part of the additional interlayer insulating film, and the additional waveguide portion formed by embedding, in the additional concave portion, a material having a refractive index larger than the additional interlayer insulating film, to form an optical waveguide through the formation of the wiring layer and each of the additional wiring layer formed by the at least one additional forming and connection of the waveguide portion and each of the additional waveguide portion formed by the at least one additional forming, the optical waveguide extending from a position at a last formed wiring layer of the each of the additional wiring layer formed up to a position of the wiring in the wiring layer.

2. The method of manufacturing a solid-state image pickup apparatus according to claim 1,
wherein the material embedded in the concave portion and each of the additional concave portion formed is selected from a group consisting of a silicon nitride, a silicon oxynitride, a hafnium oxide, and a tantalum oxide.

3. The method of manufacturing a solid-state image pickup apparatus according to claim 1,
wherein the optical waveguide extends from a position of an area of the last formed wiring layer of the each of the additional wiring layer formed, the area being at a surface of the last formed wiring layer of the each of the additional wiring layer formed remote from the wiring layer.

* * * * *